(12) United States Patent
Hwang

(10) Patent No.: US 7,700,433 B2
(45) Date of Patent: Apr. 20, 2010

(54) MIM TYPE CAPACITOR

(75) Inventor: Sang-Il Hwang, Wonju si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 321 days.

(21) Appl. No.: 11/752,704

(22) Filed: May 23, 2007

(65) Prior Publication Data

US 2007/0273005 A1     Nov. 29, 2007

(30) Foreign Application Priority Data

May 25, 2006   (KR) .................... 10-2006-0046961

(51) Int. Cl.
*H01L 21/8242*  (2006.01)

(52) U.S. Cl. ............... 438/243; 438/244; 438/386; 438/255; 438/387; 438/398; 257/301; 257/E27.092; 257/E21.012; 257/E21.02; 257/303; 257/306; 257/532; 257/E27.016; 257/E27.024; 257/E27.025; 257/E27.048; 257/E27.071; 257/E29.342

(58) Field of Classification Search .................. None
See application file for complete search history.

(56) References Cited

U.S. PATENT DOCUMENTS

| 7,534,692 | B2 * | 5/2009 | Jagueneau et al. ........... 438/386 |
| 2001/0028545 | A1 * | 10/2001 | Hayashi ...................... 361/303 |
| 2005/0145988 | A1 * | 7/2005 | Akiyama ..................... 257/532 |

* cited by examiner

*Primary Examiner*—Minh-Loan T Tran
*Assistant Examiner*—Fei Fei Yeung Lopez
(74) *Attorney, Agent, or Firm*—Sherr & Vaughn, PLLC

(57) ABSTRACT

A method of fabricating an MIM type capacitor includes at least one of: Forming a first trench within an insulating interlayer formed on a semiconductor substrate. Forming a lower electrode layer of a metal nitride layer substance to fill an inside of the first trench. Forming a second trench on a surface of the lower electrode layer to have a depth less than the first trench. Forming a capacitor dielectric layer conformal along a surface of the lower electrode layer including the second trench. Forming an upper electrode layer of a metal nitride layer substance on the capacitor dielectric layer. Sequentially patterning the upper electrode layer and the capacitor dielectric layer by photolithography.

8 Claims, 3 Drawing Sheets

MIM TYPE CAPACITOR

This application claims the benefit of the Korean Patent Application No. P2006-46961, filed on May 25, 2006, which is hereby incorporated by reference in its entirety.

BACKGROUND

In some areas of semiconductor technology, increases in integration of semiconductor devices has fueled efforts to research and develop relatively small-scale capacitors having sufficient capacitance. Methods of increasing capacitance include increasing the area of a capacitor, decreasing the thickness of a dielectric layer between two electrodes of a capacitor, and/or replacing a dielectric layer of a capacitor with a material having a large dielectric constant.

When replacing a capacitor dielectric layer with a material having a large dielectric constant, a high dielectric constant materials such as $Ta_2O_5$, [(Ba, Sr)TiO], [(Pb, La) (Zr, Ti)O], and/or similar materials may be used. However, in order to apply these types of materials in a capacitor, a relatively expensive electrode may be formed of Pt (or similar material) to compensate for leakage current characteristics, which may result in increased manufacturing costs.

SUMMARY

Embodiments relate to an MIM (Metal/Insulator/Metal) type capacitor in a semiconductor device. Embodiments relate to fabricating an MIM (Metal/Insulator/Metal) type capacitor in a semiconductor device.

In embodiments, capacitance of an MIM type capacitor may be sufficiently maintained by increasing the effective area of the capacitor. In embodiments, a surface area of a lower electrode of a capacitor may be increased by forming the lower electrode having an uneven surface.

In embodiments, a method of fabricating an MIM type capacitor includes at least one of: Forming a first trench within an insulating interlayer formed on a semiconductor substrate. Forming a lower electrode layer of a metal nitride layer substance to fill an inside of the first trench. Forming a second trench on a surface of the lower electrode layer to have a depth less than the first trench. Forming a capacitor dielectric layer conformal along a surface of the lower electrode layer including the second trench. Forming an upper electrode layer of a metal nitride layer substance on the capacitor dielectric layer. Sequentially patterning the upper electrode layer and the capacitor dielectric layer by photolithography.

In embodiments, a plurality of the second trenches may be formed on the surface of a lower electrode layer, making the surface of the lower electrode layer uneven. An uneven surface area of a lower electrode layer may be increased to increase the effective area of a capacitor.

In embodiments, a method may include forming an insulating layer that acts as an etch stop layer while forming a via hole for a contact between an upper electrode layer and an upper metal line. In embodiments, an upper electrode layer may be patterned by an reactive ion etch for metal and/or a capacitor dielectric layer may be patterned by a chemical dry etch.

In embodiments, a MIM type capacitor may include at least one of the following: An insulating interlayer formed on a semiconductor substrate including a first trench. A lower electrode layer of a metal nitride layer material that fills the inside of a first trench. A lower electrode layer having a second trench on its surface having a depth less than the depth of a first trench. A capacitor dielectric layer formed conformal on the surface of a lower electrode layer that includes a second trench. An upper electrode layer of a metal nitride layer material formed on a capacitor dielectric layer opposing a lower electrode layer.

In embodiments, a plurality of second trenches are formed on the surface of a lower electrode layer to make the surface of the lower electrode layer uneven.

BRIEF DESCRIPTION OF THE DRAWINGS

Example

DESCRIPTION

Figure 1A:
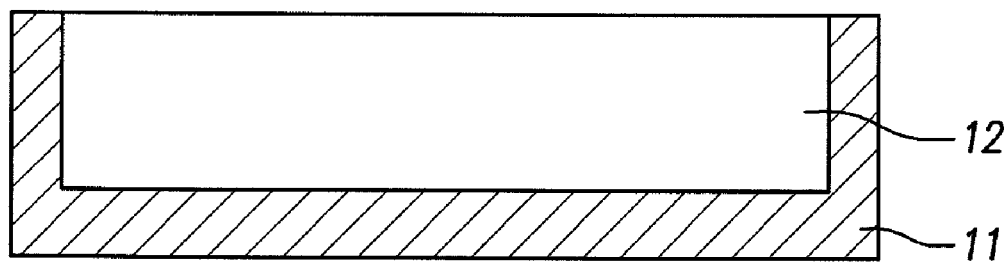
FIGS. 1A to 1H are cross-sectional diagrams of a method of fabricating an MIM type capacitor, in accordance with embodiments.
Figure 1B:
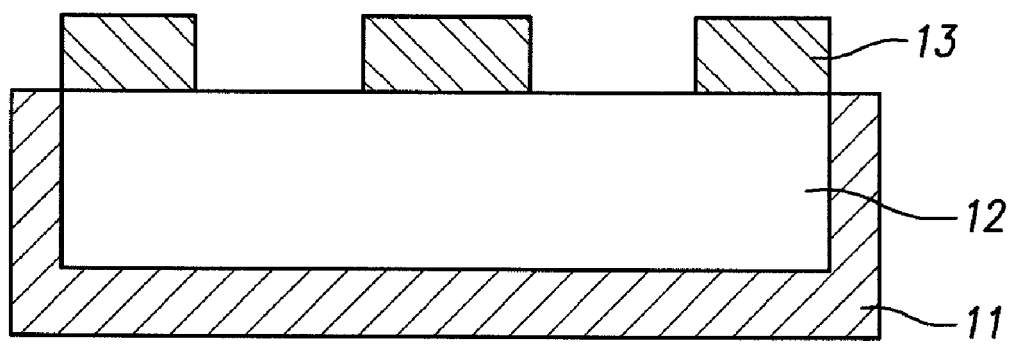
Figure 1C:
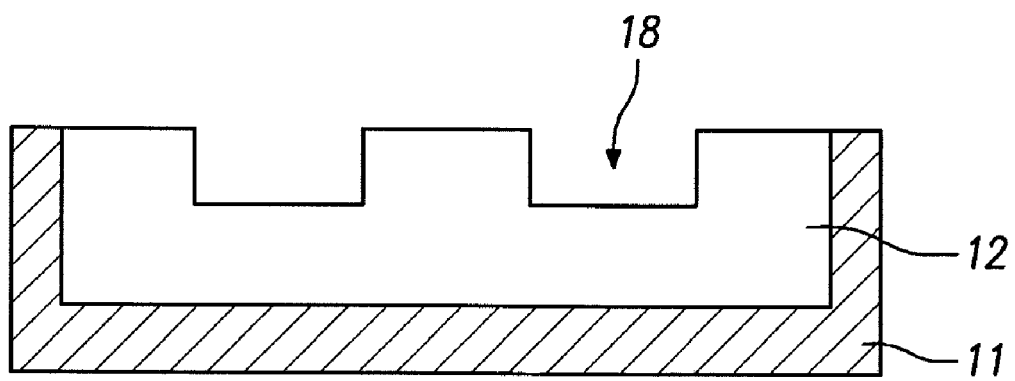
Figure 1D:
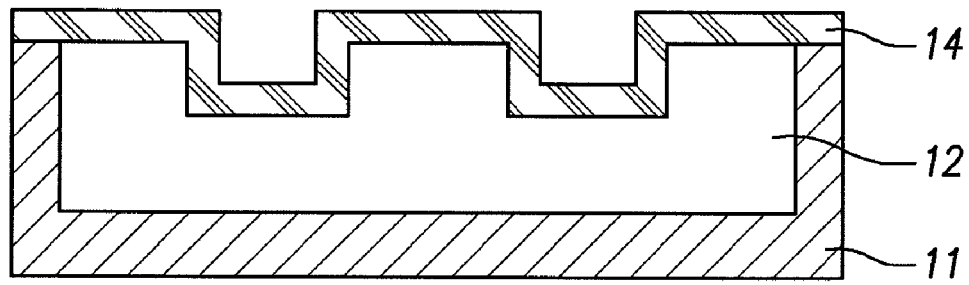
Figure 1E:
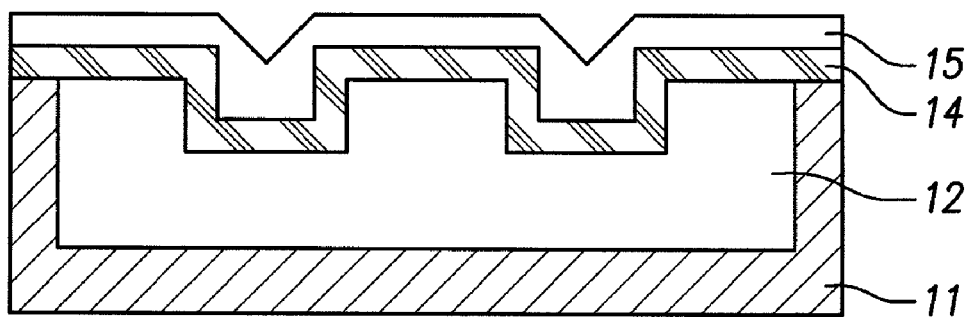
Figure 1F:
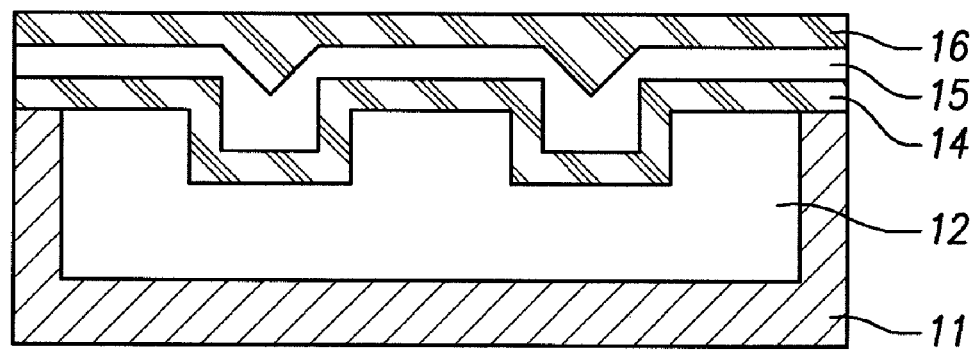
Figure 1G:
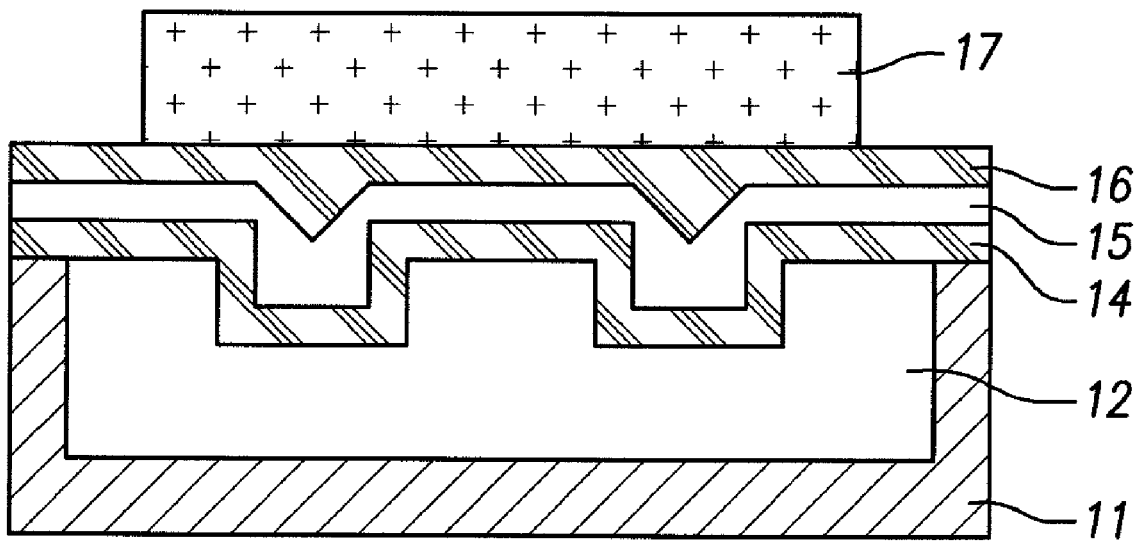
Figure 1H:
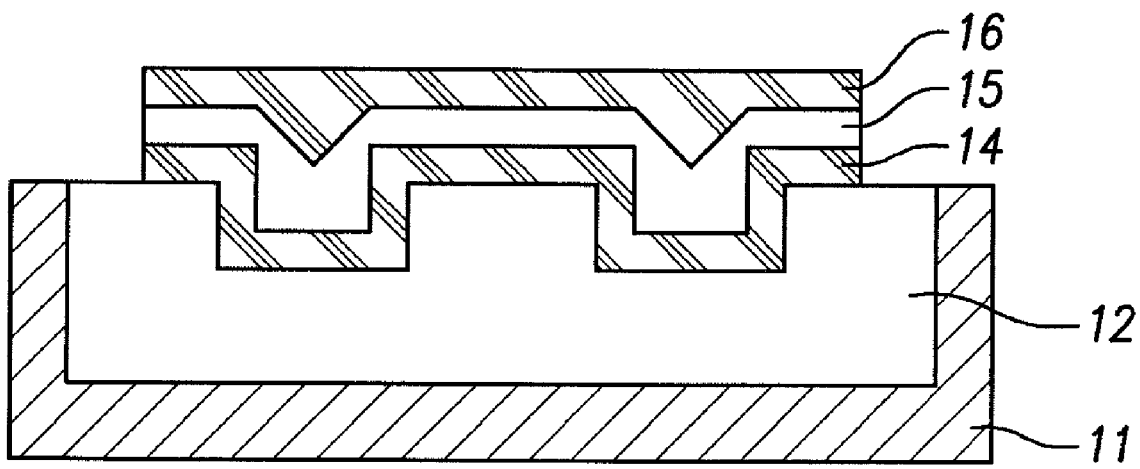

An MIM type capacitor, according to embodiments, is illustrated in example FIG. 1H. Lower electrode layer 12 having an uneven shape is formed over insulating interlayer 11. Insulating interlayer 11 may be formed over a semiconductor substrate. Capacitor dielectric layer 14 may be formed over lower electrode layer 12 and may conform with an uneven surface of lower electrode layer 12. Upper electrode layer 15 may be formed over capacitor dielectric layer 14. Insulating layer 16 may be formed over upper electrode layer 15. In embodiments, lower electrode layer 12, capacitor dielectric layer 14, and upper electrode layer 15 may be etched into specific patterns.

A method of fabricating a MIM type capacitor is illustrated in example FIGS. 1A to 1H, in accordance with embodiments. As illustrated in example FIG. 1A, a first trench may be formed over insulating interlayer 11 from on a semiconductor substrate. The first trench may be filled with lower electrode layer 12. In embodiments, lower electrode layer 12 may be formed of titanium nitride (TiN). In embodiments, the material (e.g. TiN) of lower electrode layer 12 may be deposited over the semiconductor substrate including the inside of the first trench. The material of lower electrode layer 12 may be planarized to expose a portion of insulating layer 11, thus forming the lower electrode layer 12 inside the trench.

In embodiments, lower electrode layer 12 is formed of a metal nitride (e.g. Ta and/or TiN). If Al or W is used as the metal, a barrier metal layer may also need to be formed to prevent metal corrosion. In embodiments, a double-layered lower electrode layer may be formed including a metal layer and a barrier metal layer. One of ordinary skill in the art would appreciate different materials that may be used to form lower electrode layer 12.

In embodiments, a second trench may be formed within lower electrode layer 12. Although Cu may be used as a material of lower electrode layer 12, Cu may be relatively difficult to etch. In embodiments, the thickness of lower electrode layer 12 may be approximately 2,000 Å. However, one of ordinary skill in the art would appreciate that other dimensions may be used for the thickness of lower electrode layer 12.

As illustrated in example FIG. 1B, a photoresist pattern 13 may be formed over lower electrode layer 12. Lower electrode layer 12 may be etched to a prescribed thickness using the photoresist pattern 13 as a mask. In embodiments, dry etching (e.g. reactive ion etch: RIE) may be performed on the lower electrode layer 12 to etch lower electrode layer 12 to a prescribed thickness using the photoresist pattern 13 as a mask.

As illustrated in example FIG. 1C, as a result of etching lower electrode layer 12 (e.g. dry etching), a second trench 18 may be formed in the lower electrode layer 12. In embodiments, the depth of the second trench 18 may be approximately 600 Å. In embodiments, the depth of the second trench 18 is smaller than the depth of the first trench.

As illustrated in example FIG. 1C, a surface profile of the lower electrode layer 12 with the second trench 18 may have an uneven shape, in accordance with embodiments. In embodiments, a plurality of second trenches 18 may be formed to increase the surface area of the lower electrode 12. In embodiments, any practical number of second trenches 18 and gaps between second trenches 18 can be formed. In embodiments, the number of second trenches 18 and gaps are based on an effective area of a capacitor for capacitance required by a design rule.

As illustrated in example FIG. 1D, a capacitor dielectric layer 14 may be formed that conforms to the uneven shape of the lower electrode 12. In embodiments, the capacitor dielectric layer 14 is formed along the uneven shape of the lower electrode layer 12. In embodiments, the capacitor dielectric layer 14 is formed of at least one of silicon oxide, silicon nitride, tantalum oxide, hafnium oxide, aluminum oxide, and/or a material with similar characteristics. In embodiments, a thickness of the capacitor dielectric layer 14 is approximately 300 Å.

In embodiments where the capacitor dielectric layer 14 is formed to conform with the surface profile of the lower electrode layer 12, the dielectric layer 14 may be formed to have the uneven shape as well.

As illustrated in example FIG. 1E, in accordance with embodiments, an upper electrode layer 15 may be formed over the capacitor dielectric layer 14. In embodiments, the upper electrode layer 15 may be formed by depositing titanium nitride (TiN) over the capacitor dielectric layer 14. In embodiments, the upper electrode layer 15 may have a thickness of approximately 600 Å.

As illustrated in example FIG. 1F, an insulating layer 16 may be formed over the upper electrode layer 15. The insulating layer 16 may act as an etch stop layer in an etch process for forming a via hole within an insulating interlayer, in accordance with embodiment. A via hole may be for forming a contact between a metal line formed over the capacitor and an upper electrode layer. In embodiments, the insulating layer 16 may have a thickness of approximately 600 Å.

As illustrated in example FIG. 1G, in order to form a capacitor having a specific width, a photoresist pattern 17 may be formed over the insulating layer 16, in accordance with embodiments. In embodiments, the width of the photoresist pattern 17 may be large enough to accommodate an uneven shape of the lower electrode layer 12 formed underneath the photoresist patter 17.

As illustrated in example FIG. 1H, the insulating layer 16, the upper electrode layer 15, and the capacitor dielectric layer 14 may be sequentially etched using the photoresist pattern 17 as an etch mask. In embodiments, the insulating layer 16 and the capacitor dielectric layer 14 may be etched by chemical dry etching and/or the upper electrode layer 15 may be etched by reactive ion etching for metal.

In embodiments, the capacitor dielectric layer 14 may be formed relatively thin. If reactive ion etching is used to etch both the upper electrode layer 15 and the capacitor dielectric layer 14, a bridge may be formed between the upper electrode layer 15 and the lower electrode layer 12, thus possibly creating a short circuit. Accordingly, in embodiments, the capacitor dielectric layer 14 is etched by chemical dry etching so that the upper metal layer 15 is not affected and a bridge formation may be prevented. Accordingly, an MIM capacitor including the lower electrode layer 12, the capacitor dielectric layer 14, and the upper electrode layer 15 may be fabricated.

In embodiments, the capacitance of a capacitor may be inversely proportional to the thickness of the capacitor dielectric layer 14 and proportional to an effective area of the lower electrode layer 12 or the upper electrode layer 15. In embodiments where the surface of the lower electrode layer 12 of the MIM capacitor has an uneven shape, the effective area of the capacitor may be increased or maximized, resulting in the capacitor being enhanced.

In embodiments, since a lower electrode of a capacitor may have an uneven shape to increase its effective area, a capacitor may have more desirable capacitance characteristics than other capacitors that use materials having the same dielectric constant in the dielectric layer.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of comprising:
   forming a first insulating layer over a semiconductor substrate;
   forming a first trench in the first insulating interlayer;
   forming a lower electrode layer inside the first trench;
   forming a second trench in the lower electrode layer;
   forming a dielectric layer over the lower electrode layer and inside the second trench;
   forming an upper electrode layer over the dielectric layer;
   sequentially patterning the upper electrode layer and the dielectric layer by photolithography,
   wherein the sequentially patterning step comprises:
   patterning the upper electrode layer by reactive ion etching for metal; and
   patterning the dielectric layer by chemical dry etching.

2. The method of claim 1, wherein the method is a method of fabricating a metal-insulator-metal capacitor.

3. The method of claim 1, wherein the lower electrode layer and the upper electrode layer comprises nitride.

4. The method of claim 1, wherein a depth of the second trench is less than a depth of the first trench.

5. The method of claim 1, comprising forming a second insulating layer over the upper electrode layer, wherein said sequentially patterning comprising patterning the second insulating layer.

6. The method of claim 1, wherein a surface of the lower electrode layer has an uneven shape from the second trench.

7. The method of claim 1, comprising forming a second insulating layer over the upper electrode layer, wherein the second insulating layer acts as an etch stop layer in forming a via hole over the upper electrode layer.

8. The method of claim 1, wherein the dielectric layer is a dielectric capacitor layer.

* * * * *